United States Patent
Jaquette et al.

(10) Patent No.: US 7,217,139 B2
(45) Date of Patent: May 15, 2007

(54) INTERCONNECT ASSEMBLY FOR A PROBE CARD

(75) Inventors: Jim Jaquette, Mesa, AZ (US); Gene Tokraks, Gilbert, AZ (US); Steve Fahrner, Chandler, AZ (US)

(73) Assignee: Antares Advanced Test Technologies, Inc., Vancouver, WA (US)

( * ) Notice: Subject to any disclaimer, the term of this patent is extended or adjusted under 35 U.S.C. 154(b) by 0 days.

(21) Appl. No.: 11/198,995

(22) Filed: Aug. 8, 2005

(65) Prior Publication Data

US 2006/0035485 A1   Feb. 16, 2006

Related U.S. Application Data

(60) Provisional application No. 60/600,512, filed on Aug. 11, 2004.

(51) Int. Cl.
*H01R 12/00* (2006.01)
(52) U.S. Cl. .................................................. 439/66
(58) Field of Classification Search .............. 439/66, 439/67, 71, 70
See application file for complete search history.

(56) References Cited

U.S. PATENT DOCUMENTS

| | | | |
|---|---|---|---|
| 5,139,427 A * | 8/1992 | Boyd et al. ............... 439/66 |
| 5,173,055 A * | 12/1992 | Grabbe ..................... 439/66 |
| 5,629,837 A | 5/1997 | Barabi et al. |
| 5,672,978 A * | 9/1997 | Kimura ..................... 324/754 |
| 5,800,184 A | 9/1998 | Lopergolo et al. |
| 6,029,344 A | 2/2000 | Khandros et al. |
| 6,042,387 A | 3/2000 | Jonaidi |
| 6,114,869 A | 9/2000 | Williams et al. |
| 6,890,185 B1 | 5/2005 | Kister et al. |
| 6,957,963 B2 * | 10/2005 | Rathburn .................. 439/66 |
| 7,059,865 B2 * | 6/2006 | Kister et al. .............. 439/66 |
| 2002/0080588 A1 | 6/2002 | Eldridge et al. |
| 2005/0159025 A1 | 7/2005 | Kister et al. |

OTHER PUBLICATIONS

U.S. Appl. No. 60/645,895, filed Jan. 21, 2005; titled: "Connector System".
U.S. Appl. No. 60/646,927, filed Jan. 24, 2005; titled: "Connector Assembly".

* cited by examiner

*Primary Examiner*—Phuong Dinh
(74) *Attorney, Agent, or Firm*—Marger Johnson & McCollom, P.C.

(57) ABSTRACT

An interconnect assembly for providing electrical interconnection between elements of a probe card assembly is provided. The interconnect assembly includes a frame defining a plurality of openings and a plurality of conductive contacts coupled to the frame. Each of the conductive contacts includes (a) a first resilient arm extending away from a first surface of the frame and (b) a second resilient arm extending away from a second surface of the frame. At least one of the first resilient arm or the second resilient arm extends through one of the plurality of openings.

21 Claims, 6 Drawing Sheets

INTERCONNECT ASSEMBLY FOR A PROBE CARD

CROSS-REFERENCE TO RELATED APPLICATION

This application claims the benefit of U.S. Provisional patent application No. 60/600,512, filed Aug. 11, 2004 which is incorporated by reference in its entirety.

FIELD OF THE INVENTION

The invention relates to interconnect assemblies and, more particularly, to an interconnect assembly adapted for use in a probe card used to test integrated circuit devices (e.g., semiconductor wafers).

BACKGROUND OF THE INVENTION

Probe cards are commonly used in the testing of integrated circuit devices, including memory chips. One example of a probe card is available from Kulicke and Soffa Industries, Inc. and has, on one side, an array of metal probes that are arranged to make contact with external electrical contacts, usually in the form of pads or bumps, on a device under test (DUT) (e.g., a die on a wafer). Exemplary probes may be, for example, coupled to a substrate at one end (e.g., a space transformer) or mounted within a probe head. Typical probe cards also include a printed circuit board (PCB) with traces that can be connected to an electronic test system. A space transformer is typically included in applications where the spacing of the traces on the PCB is wider than the spacing of the pads on the integrated circuit device to be tested.

In certain test assemblies, the probe card is electrically connected to the test head of the electronic test system using an interface system. For example, the interface system may include double headed electrically conductive spring pins, also referred to as "pogo" pins, that are mounted in a carrier. One end of each pogo pin contacts a conductive pad of the probe card. The other end of the pogo pin contacts the test apparatus. U.S. Pat. No. 6,114,869, assigned to the assignee of the instant application, describes one example of such an interface system.

Often, probe cards include an interposer disposed between the PCB and the space transformer. Unfortunately, many interposers of conventional probe cards (e.g., pogo pin configurations) are mechanically complicated and costly, and the structures often have difficulty providing the close pitch desired in probe card assemblies. Thus, it would be desirable to provide an interconnect structure for a probe card overcoming one or more of the deficiencies of conventional interposers.

SUMMARY OF THE INVENTION

According to an exemplary embodiment of the present invention, an interconnect assembly for providing electrical interconnection between elements of a probe card assembly is provided. The interconnect assembly includes a frame defining a plurality of openings and a plurality of conductive contacts coupled to the frame. Each of the conductive contacts includes (a) a first resilient arm extending away from a first surface of the frame and (b) a second resilient arm extending away from a second surface of the frame. At least one of the first resilient arm or the second resilient arm extends through one of the plurality of openings.

According to another exemplary embodiment of the present invention, a probe card assembly is provided. The probe card assembly includes a space transformer including a first plurality of conductive regions adjacent a first surface of the space transformer, and a printed circuit board including a second plurality of conductive regions adjacent a first surface of the printed circuit board. The probe card assembly also includes an interconnect assembly providing electrical interconnection between the space transformer and the printed circuit board. The interconnect assembly includes (a) a frame defining a plurality of openings, and (b) a plurality of conductive contacts coupled to the frame. Each conductive contact includes (1) a first resilient arm extending away from a first surface of the frame and (2) a second resilient arm extending away from a second surface of the frame. At least one of the first resilient arm or the second resilient arm extends through one of the plurality of openings.

According to yet another exemplary embodiment of the present invention, an interposer for providing electrical interconnection between elements of a probe card assembly is provided. The interposer includes a first interconnect assembly and a second interconnect assembly. The first interconnect assembly includes (1) a first frame defining a plurality of first openings, and (2) a plurality of first conductive contacts coupled to the first frame. Each first conductive contact includes (a) a first resilient arm extending away from a first surface of the first frame and (b) a second resilient arm extending away from a second surface of the first frame. At least one of the first resilient arm or the second resilient arm of the first conductive contact extends through one of the plurality of first openings. The second interconnect assembly includes (1) a second frame defining a plurality of second openings, and (2) a plurality of second conductive contacts coupled to the second frame. Each second conductive contact includes (a) a first resilient arm extending away from a first surface of the second frame and (b) a second resilient arm extending away from a second surface of the second frame. At least one of the first resilient arm or the second resilient arm of the second conductive contact extends through one of the plurality of second openings. A conductive path is provided between corresponding pairs of first conductive contacts of the first interconnect assembly and second conductive contacts of the second interconnect assembly.

BRIEF DESCRIPTION OF THE DRAWINGS

For the purpose of illustrating the invention, there are shown in the drawings forms of the invention which are presently preferred; it being understood, however, that this invention is not limited to the precise arrangements and instrumentalities shown.

DETAILED DESCRIPTION OF THE DRAWINGS

U.S. Pat. Nos. 5,629,837; 6,042,387; and 6,890,185, as well as U.S. patent application Publication No. 2005/0159025, as well as U.S. Provisional Patent Application Nos. 60/645,895 and 60/646,927, relate to electrical connection technology and are each incorporated by reference in their entireties.

In certain exemplary embodiments of the present invention, an interposer for use in providing electrical interconnection between a substrate (e.g., an MLO or MLC space transformer) and a printed circuit board (PCB) in a vertical probe card assembly is provided. The exemplary interposer includes an insulating sheet (e.g., a spacer substrate) located between two interconnect assemblies. The insulating sheet has conductors (e.g., plated vias) extending from one side of the insulating sheet to the other. Each interconnect assembly includes a layer of insulating material and a plurality of conductive contacts. The conductive contacts of each interconnect assembly are arranged so as to project resiliently from both sides of the interconnect assembly. Conductive contacts are positioned to extend from one side of the interconnect assembly and to make contact with a conductor on the insulating sheet. Conductive contacts are positioned to extend from the other side of the interconnect assembly and to make contact with an adjacent conductive pad, such as a conductive pad on the PCB or the substrate.

In an exemplary embodiment of the present invention, the insulating sheet is a printed circuit board (PCB) which is located between the two interconnect assemblies. The conductors in the PCB are through-holes or vias providing an array of conductive connections from one side of the PCB to the other.

The basic aspects of the present invention may be combined in a number of forms. The preferred aspects of the various constructions may be used in conjunction with one another or used alone. The various features provide certain advantages over the prior art. These advantages will be described herein and will be understood by those skilled in the art upon reviewing the description and drawings.

Figure 1:
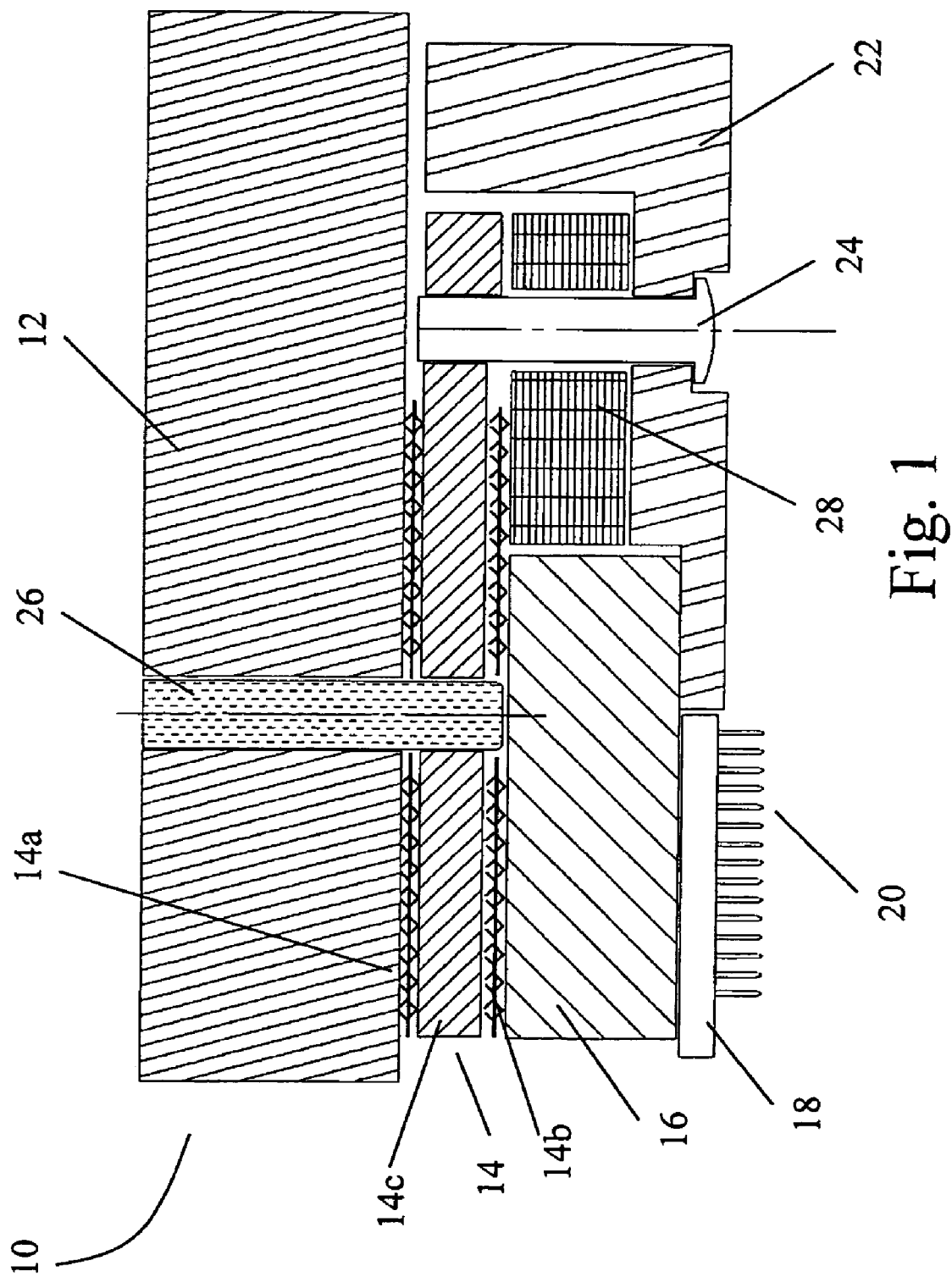
FIG. 1 is a schematic view of a portion of a probe card assembly including an interposer in accordance with an exemplary embodiment of the present invention.

Referring to the drawings, wherein like reference numerals identify similar elements in the various Figures, there is shown in FIG. 1 a schematic view of a portion of a probe card assembly according to the present invention, indicated generally by the reference numeral 10. The probe card assembly 10 includes a printed circuit board (PCB) 12, an interposer 14, a substrate (e.g., a space transformer) 16, and a probe head 18.

The probe head 18 includes a large number of probe pins 20 that, in use of the probe card 10, are intended to engage external pads, bumps, or other electrical contacts on an integrated circuit device (not shown) that is to be tested. The interposer 14 and the space transformer 16 may be held together, and secured to the PCB 12, by a retaining collar 22, using mounting screws or other fasteners 24 as appropriate. Alignment is provided by guides, such as dowels 26. A spacer 28 is also illustrated. It should be understood that the present invention is not limited in application to probe cards having probe pins engaged with a probe head. The probe pins of the probe card, for example, could be coupled to a substrate (e.g., a space transformer) without a probe head. Any suitable arrangement of probes known to those skilled in the art could be used and, thus, no further description is necessary.

Referring again to the exemplary configuration shown in FIG. 1, during use the rear ends of the probe pins 20 (the upper ends as seen in FIG. 1) are arranged so as to engage probe pads (not illustrated in FIG. 1) on the probe side of the space transformer 16. The configuration and positioning of the probe pins 20 is designed to provide the necessary electrical connection between the contacts on the integrated circuit device to be tested and the probe pads of space transformer 16.

A side of the space transformer 16 (top face in FIG. 1) opposite the probe pins 20, also sometimes referred to as the "PCB face," has contacts that are designed to be electrically connected to contacts on the PCB 12 (the contacts on PCB 12 are not shown in the schematic representation of FIG. 1). In the depicted embodiment, the connection is provided by interposer 14. The position and spacing of the contacts on the PCB 12 may be identical to that of the contacts on the top face of the space transformer 16. Alternatively, there may be a shift in the X and/or Y direction between the positions of the contacts on the PCB 12 and the contacts on the PCB face of the space transformer 16. Conductive traces that extend through the PCB join the contacts (which would be on the bottom face of PCB 12 in FIG. 1 adjacent interposer 14, but are not shown) with contact pads on the opposite side of the PCB (which would be on the top face of PCB 12 in FIG. 1, but are not shown) that are sufficiently spaced to permit easy external testing.

In the exemplary embodiment shown in FIG. 1, the space transformer 16 may be, for example, an MLC substrate or an MLO substrate. In such multi-layered embodiments, each layer may include conductive traces formed on a surface of the layer. The multiple conductive layers are stacked into the laminate with the traces being located between the layers. Conductive vias, in the form of metal-plated through holes passing through one or more of the layers, may be included to connect traces on each layer. In a simple exemplary arrangement, each via emerging through the top layer is connected by a path of traces and vias to a via emerging through the bottom layer, with each path being electrically separated from the remaining paths. Capacitors and other components may be mounted on the PCB face of the space transformer 16 if desired.

The interposer 14 may serve to accommodate slight variations in the height of the contacts on the PCB 12 and the space transformer 16 (i.e., the position of the contacts in a direction perpendicular to the general plane of the PCB 12, the interposer 14, and the space transformer 16). Such variations in contact position may occur, for example, because the surfaces of the PCB 12 and the space transformer 16 are not flat (e.g., because the PCB is warped, the space transformer is distorted during manufacture, because the surfaces are not perfectly parallel, etc.).

In the exemplary configuration illustrated in FIG. 1, interposer 14 includes a first interconnect assembly 14*b* adjacent the space transformer 16, a second interconnect assembly 14a adjacent the PCB 12, and an insulating sheet 14c (e.g., a spacer substrate) disposed therebetween. For example, insulating sheet 14c may a substrate or PCB having conductive paths (e.g., plated vias) extending from (a) a first surface of insulating sheet 14c adjacent first interconnect assembly 14b to (b) a second surface of insulating sheet 14c adjacent second interconnect assembly 14a.

As will be explained in greater detail below, each interconnect assembly (e.g., 14a and 14b) of interposer 14 may be a multi-layered structure including an insulative sheet (e.g., an insulative frame or grid) and a plurality of conductive contacts extending above and below the insulative sheet.

The interposer 14 illustrated in FIG. 1 includes two interconnect assemblies (i.e, 14a and 14b) separated by an insulating sheet 14c; however, alternative configurations are contemplated. For example, referring now to FIG. 2, a portion of an exemplary probe card is illustrated in schematic form, with various elements (e.g., the probe elements) removed for simplicity. The exemplary probe card includes PCB 112 having contacts 112a (e.g., contact pads 112a, conductive traces 112a, etc.) and substrate 116 (e.g., space transformer 116) including contacts 116a (e.g., contact pads 116a, conductive traces 116a, etc.). Providing electrical interconnection between PCB 112 and space transformer 116 is interconnect assembly 114. Interconnect assembly 114 includes a plurality of conductive contacts 200 supported by a flexible substrate 202. For example, flexible substrate 202 may be a polyimide substrate, and conductive contacts 200 may be selectively plated (or otherwise deposited, such as by etching a conductive layer) onto substrate 202, where each of the conductive contacts is manipulated (e.g., mechanically) to have the illustrated shape.

Each of conductive contacts 200 includes (a) a central body portion 200c in contact with flexible substrate 202, (b) a upper contact arm 200a configured to be in contact with contact 112a of PCB 112, and (c) a lower contact arm 200b configured to be in contact with contact 116a of space transformer 116. Spacers/shims 204 are also preferably provided as a mechanical stop to ensure that interconnect assembly 114 does not compress beyond a desired level.

Figure 2:
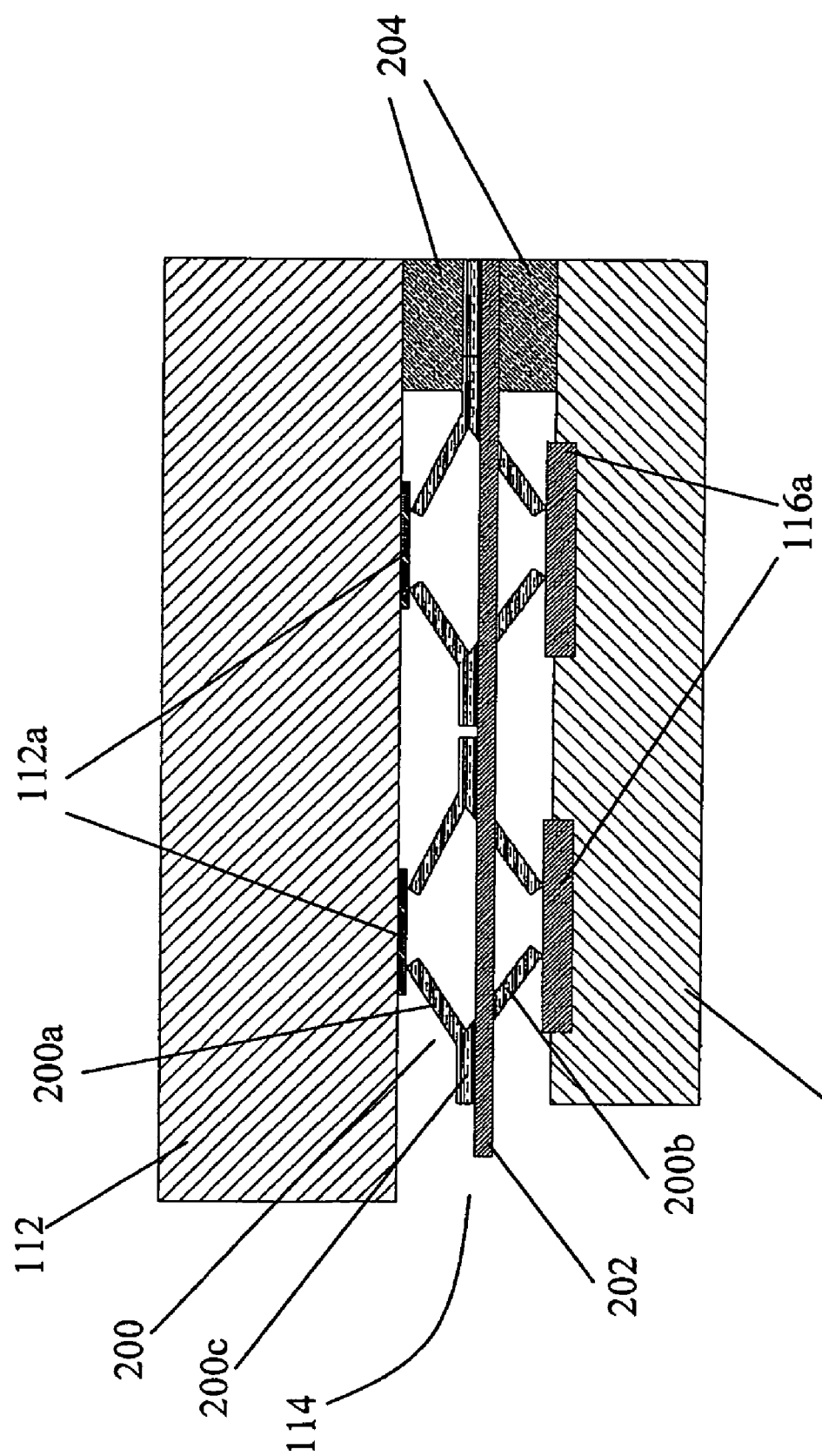
FIG. 2 is a schematic side view of a portion of a probe card assembly including an interconnect assembly in accordance with an exemplary embodiment of the present invention.

As is clear from viewing FIG. 2 in contrast to FIG. 1, a single interconnect assembly 114 according to the present invention may be used to provide resilient electrical interconnection between a PCB and a space transformer of a probe card, in contrast to an interposer 14 (including two interconnect assemblies 14a and 14b on opposite sides of an insulating sheet 14c). Depending on the particular application (e.g., size constraints, desired compliance, etc.), either of the illustrated configurations (as well as other configurations within the scope of the invention) may be selected.

Figures 3A, 3B:
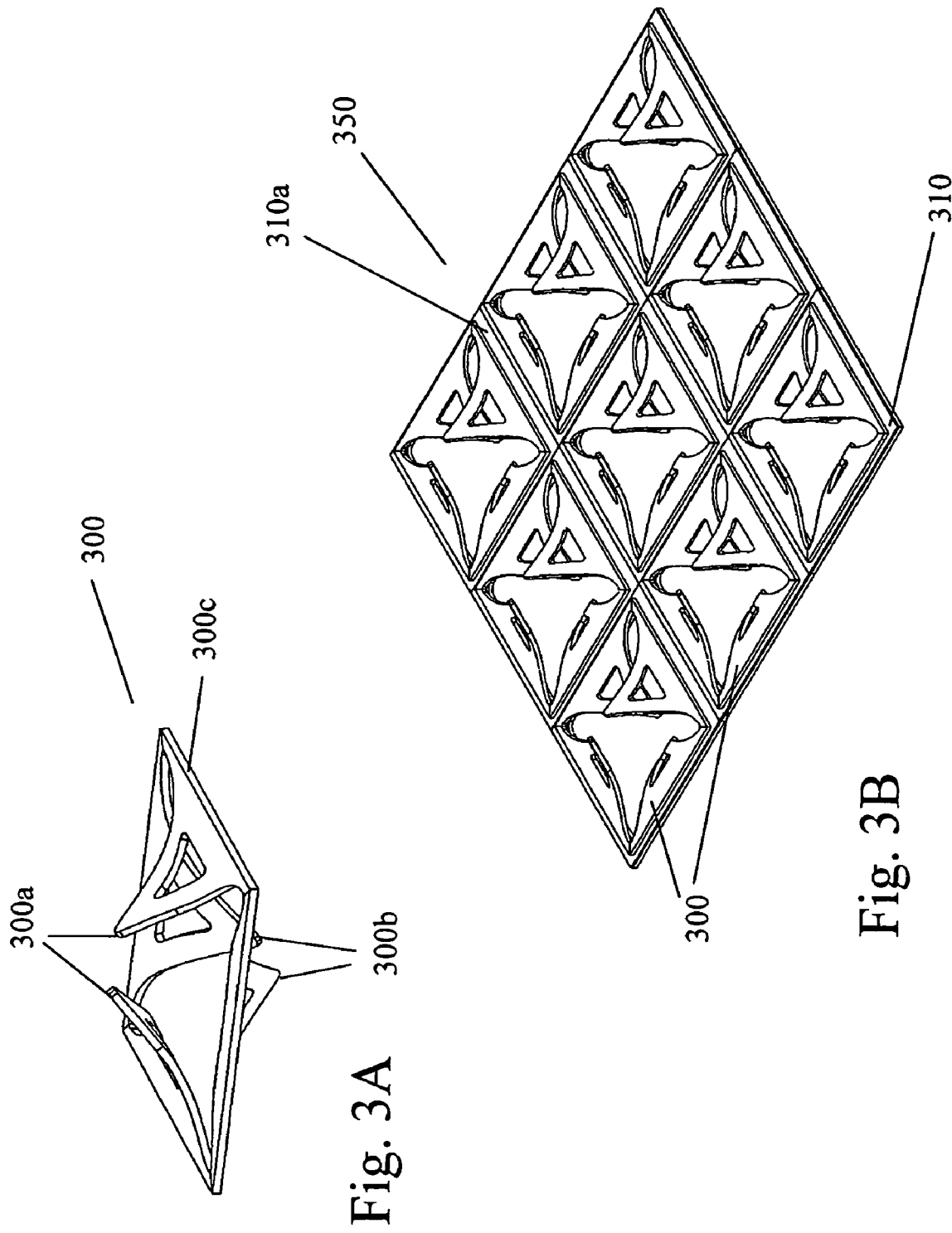
FIG. 3A is a perspective view of a conductive contact of an interconnect assembly in accordance with an exemplary embodiment of the present invention.
FIG. 3B is a perspective view of a portion of an interconnect assembly including a plurality of conductive contacts in accordance with an exemplary embodiment of the present invention.

FIG. 3A is a perspective view of a conductive contact 300. Contact 300 includes a central body portion 300c (i.e., a frame 300c), two upper contact arms 300a extending from central body portion 300c, and two lower contact arms 300b extending from central body portion 300c. As will be explained in greater detail below, contacts such as contact 300 may be formed in a number of ways such as an additive process (e.g., a selective plating process, for example, using photolithography) or a subtractive process (e.g., etching or laser processing of a conductive sheet). The process (e.g., an additive or subtractive process) may be followed by manipulation of the upper and lower "arms" to provide the desired shape.

Figure 3C:
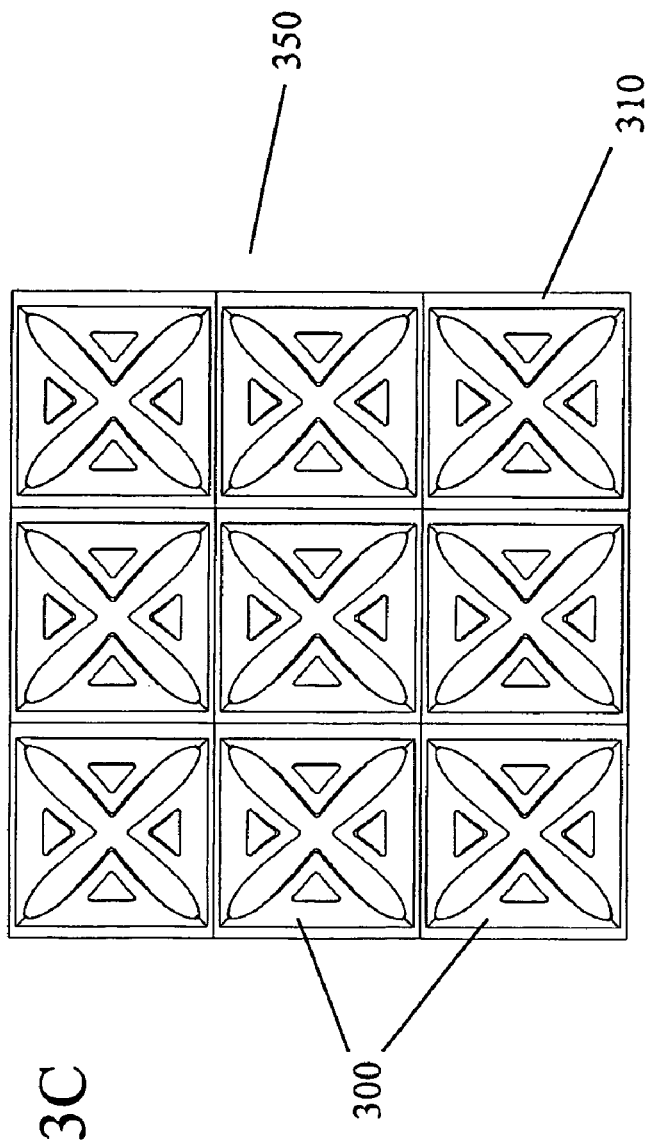
FIG. 3C is a top view of the portion of the interconnect assembly of FIG. 3B.
Figure 3D:
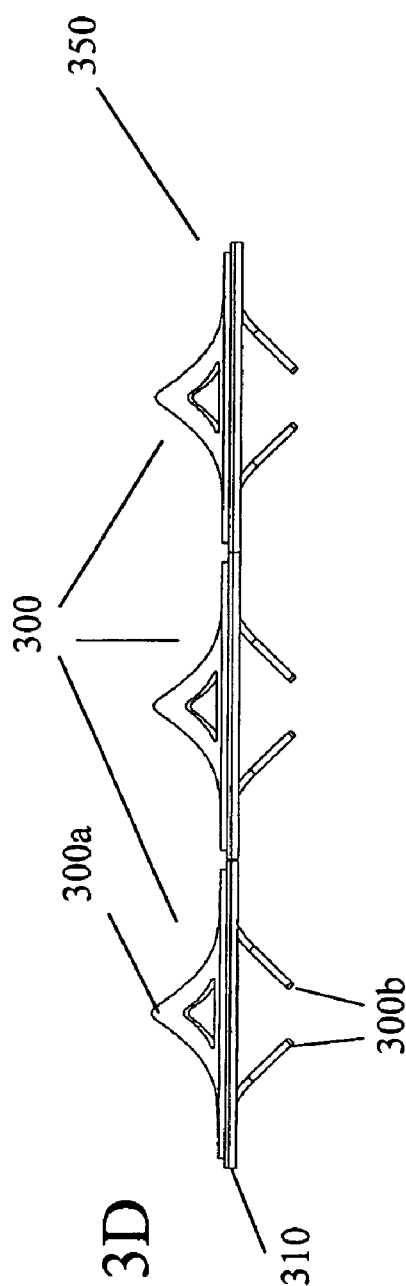
FIG. 3D is a side view of the portion of the interconnect assembly of FIG. 3B.

FIGS. 3B–3D are various views of an interconnect assembly 350 including a plurality of contacts 300. The array of contacts 300 are provided on a insulative sheet 310. The insulative sheet 310 (e.g., a polyimide sheet) defines apertures through which the lower contact arms 300b extend. Of course, a complete interconnect assembly may include many contacts 300 (e.g., hundreds or thousands of contacts or more) for use in a probe card assembly. Nine contacts 300 are illustrated in FIGS. 3B–3D for simplicity. As shown in FIG. 3B, contacts 300 are insulated from each other by spaces 310a which are part of insulative sheet 310.

In the exemplary embodiment of the present invention illustrated in FIGS. 3A–3D, each conductive contact 300 has arms 300a/300b that are substantially triangular in shape and extend to a tip which is configured to contact some portion of a probe card assembly (e.g., a conductive pad on a PCB, a conductive pad on a space transformer, a conductive region of a insulating sheet/spacer such as insulating sheet 14c of FIG. 1, etc.). The shape and tip of the arms of conductive contacts according to the present invention may be selected to provide a desired degree of resilience and/or contact force.

For example, the contacts 300 may be formed by conventional litho-graphic methods and may be bonded or otherwise attached to the grid 50, such that the central body portion 300c of each contact 300 is located around the rim of a respective cell of insulating sheet 310 (e.g., a cell of insulating sheet 300 may be an area of the sheet configured to receive a contact 300, and the corresponding aperture of insulating sheet 300 configured to receive a portion of the arms of contact 300).

In certain exemplary embodiments of the present invention, the contacts 300 are formed directly on the insulative sheet 300. For example, the contacts may be selectively plated on the sheet 300 after which the apertures may be formed (e.g., by laser ablation). Another exemplary alternative would be to use a resist material to fill the apertures of the insulating sheet 310 while the contacts 300 are being formed. After the formation of the contacts 300, the resist material can be removed using any conventional technique know to those skilled in the art. According to yet another exemplary alternative, the contacts 300 may be formed separately from the insulative sheet 310 as a continuous structure, and bonded (e.g., adhesively) to the insulating sheet 310. The parts of the structure that join the contacts 300 together (e.g., tie-bars that make the structure "continuous") can be removed (e.g., cut away) after the contacts 300 are bonded to the insulative sheet 310. The arms may then be bent out of the plane of the remainder of the insulative sheet in the directions illustrated in FIGS. 3A–3B.

Figure 4A:
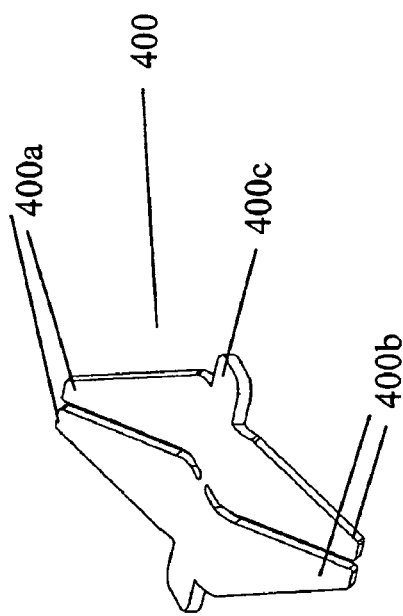
FIG. 4A is a perspective view of a conductive contact of an interconnect assembly in accordance with an exemplary embodiment of the present invention.
Figure 4B:
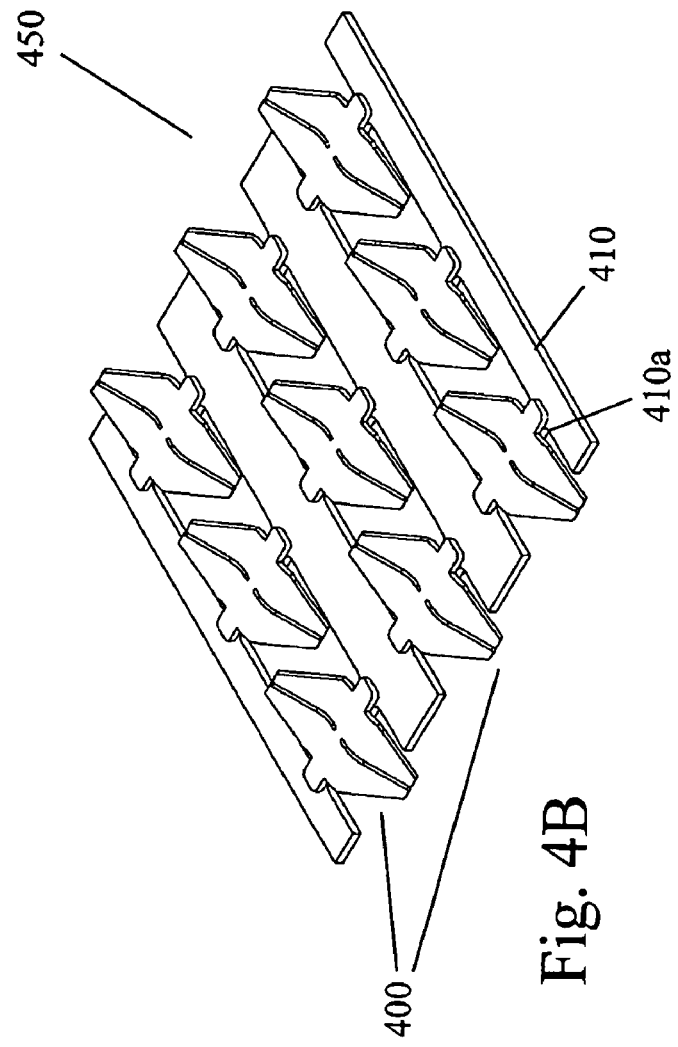
FIG. 4B is a perspective view of a portion of an interconnect assembly including a plurality of conductive contacts in accordance with an exemplary embodiment of the present invention.

FIG. 4A is a perspective view of a conductive contact 400, which has a shape different from the exemplary conductive contacts illustrated in FIG. 2 or the conductive contacts illustrated in FIGS. 3A–3D. Contact 400 includes a central body portion 400c, two upper contact arms 400a, and two lower contact arms 400b. FIG. 4B is a perspective view of an interconnect assembly 450 illustrating nine contacts 400 provided on a insulative sheet 410. Only a portion of interconnect assembly 450 is illustrated in FIG. 4B. Insulative sheet 410 (e.g., a polyimide sheet) includes portions 410a which are only partially visible in FIG. 4B, and are provided beneath central body portion 400c of each contact 400.

The conductive contact 400 described and illustrated with respect to FIG. 4A has certain benefits over other contacts such as that illustrated in FIG. 3A. This shape provides an improved interface between the conductive contact 400 and the insulative sheet 410 through the central body portion 400c. This improved interface provides an increased use of the insulating sheet 410 (e.g., a polyimide sheet) as a spring element. For example, because the central body portion 400c of contact 400 is coupled to a portion of insulating sheet 410, contact 400 rotates about this interface. Thus, a higher contact force and increased overdrive potential are provided.

As is shown in FIG. 4A, adjacent contact arms (e.g., the two upper contact arms 400a) of a given conductive contact 400 are divided by a slot/aperture. Such a slot or aperture distributes stress applied to the conductive contact (e.g., a compressive stress applied during testing of a semiconductor wafer device). Additionally, such a slot or aperture may be used to divide a signal transmitted through the respective conductive contact.

Figure 5A:
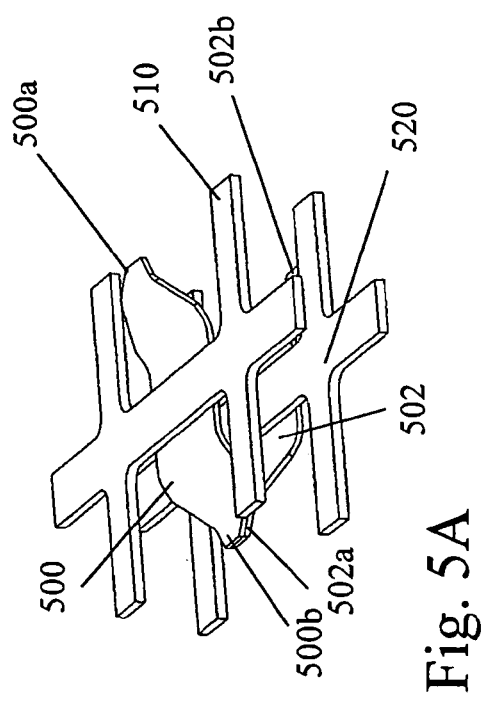
FIG. 5A is a perspective view of a portion of two interconnect assemblies in accordance with an exemplary embodiment of the present invention.
Figure 5B:
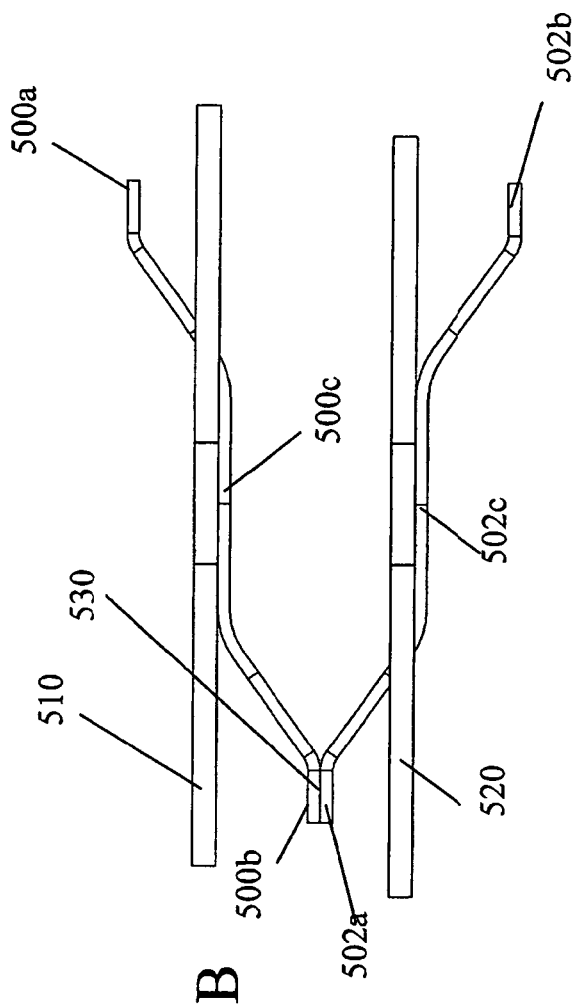
FIG. 5B is a side view of FIG. 5A.

FIGS. 5A–5B illustrate a portion of another exemplary interconnect assembly including "stacked" sets of contacts. More specifically, FIGS. 5A–5B illustrate contact 500 including central body portion 500c, upper contact arm 500a, and lower contact arm 500b. Contact 500 is secured to insulative sheet 510 which defines a plurality of apertures therethrough for receipt of a respective contact arm. It is understood that although a single contact 500 is illustrated in FIGS. 5A–5B, a plurality of contacts would be supported by insulative sheet 510 for use in connection with a probe card assembly. Another contact 502 is illustrated including central body portion 502c, upper contact arm 502a, and lower contact arm 502b. Contact 502 is secured to insulative sheet 520 which defines a plurality of apertures therethrough for receipt of a respective contact arm.

In the configuration shown in FIGS. 5A–5B, contact sets (where one contact set includes contact 500 and another contact set includes contact 502) are stacked, for example, to provide additional resilience and/or to provide additional height in a desired probe card configuration.

As opposed to the pointed tip portion of torsional contact 400 illustrated in FIG. 4A–4B, contact 500 includes flat (not pointed) ends on each of the upper contact arm 500a and lower contact arm 500b. This flat end is particularly beneficial in the stacked configuration of FIGS. 5A–5B, as it provides for an increased surface area at the interface region 530 between the contact arm 500b and contact arm 502a.

In the various exemplary embodiments of the present invention illustrated herein, a benefit is provided in that both the conductive contact (e.g., conductive contact 400 illustrated in FIGS. 4A–4B) and the insulative sheet (e.g., insulative sheet 410 illustrated in FIG. 4B) provide resilience during probing of a semiconductor device (e.g., part of a semiconductor wafer) by the probe card including the semiconductor device.

An exemplary process of forming interconnect assemblies according to the present invention is now described. An insulative sheet (e.g., a polyimide sheet) may be provided with one or both surfaces coated (e.g., by vapor deposition) with a seed layer (e.g., a thin copper layer, for example, less than 9 microns thick). A first side of the insulative sheet (with coated surface(s)) is selectively plated with a conductive material (e.g., nickel, a nickel alloy, etc.) to have the general shape (but not yet dimensionally shaped) of the desired conductive contacts. Because the plating process may be a process such as electrical deposition, the flat conductive contacts may be shorted together through tie bars or the like.

In an embodiment where both surfaces of the insulative sheet were coated with a seed layer, the second side of the insulative sheet is selectively etched to expose a portion of the insulative material of the insulative sheet (e.g., a polyimide material). For example, this selective etching may expose areas of polyimide that are substantially shaped as the apertures that will ultimately be defined by the polyimide material. The polyimide material then undergoes a laser ablation process to define apertures (e.g., rectangular apertures) in the polyimide material where the laser ablation process is configured (e.g., using power or wavelength parameters) not to interfere with the conductive plating on the opposite surface (i.e., the conductive plating having the general shape of the desired conductive contacts).

Any remaining seed layer material will ultimately be removed (e.g., by etching), and the tie bars or other shorting means for shorting the flat conductive contacts are removed (e.g., through laser ablation). The conductive contacts are then mechanically bent (e.g., using a forming block defining a desired shape groove and a punching tool such as a wire bonding tool) to have the desired shape, for example, as shown in the exemplary shapes illustrated herein (e.g., the shape illustrated in FIG. 3A, FIG. 4A, FIG. 5A, etc.). This bending process may be accomplished, for example, one side at a time.

The conductive contacts may be coated (e.g., before or after the shaping process). For example, the contact may be coated (e.g., with gold) to improve conductivity. Likewise, all or a portion (e.g., the tips of the arms) of the conductive contacts may be coated (e.g., coated with hard gold, palladium cobalt, etc.) to reduce tip wear.

Certain details understood by those skilled in the art have been omitted from this brief description. For example, the selective plating of the conductive contact material may be accomplished using a process such as photolithography or other lithographic processes.

This process is exemplary in nature, and the present invention is clearly not limited thereto. For example, certain materials are not well suited to electrical deposition processes. Thus, if such a material (e.g., beryllium copper) was selected as the material to form the conductive contacts, the material would likely not be electrically deposited, but may rather be provided as a sheet where desired portions are removed (e.g., by a subtrative process such as lasering or the like).

In certain exemplary embodiments of the present invention illustrated herein, spacers/shims (e.g., spacers 204 illustrated in FIG. 2) may be provided. For example, the thicknesses of such spacers and the shaping/bending of the arms of the conductive contacts may be selected such that the tips of the arms can provide the desired electrical contact with corresponding contact pads or the like without providing excessive contact force. The resilience of the arms (as well as the resilience of the insulative sheet) may be configured to accommodate a desired degree of unevenness in the heights of adjacent contact pads or the like.

As an example of numerical values, the spacers/shims (e.g., spacers 204 illustrated in FIG. 2) may be set to allow a clearance of about 4 mil (100 µm) on either side between the insulative sheet of each interconnect assembly and the surfaces that the tips of the contact arms are configured to engage. Of course, this clearance value is exemplary in nature, and is to be selected as desired. Further, the clearance configured above an interconnect assembly may be selected to be different than the clearance below an interconnect assembly. In such an event, the spacers/shims (e.g., spacers 204 illustrated in FIG. 2) may be selected to have different thicknesses.

According to an exemplary embodiment of the present invention, the overall thickness of the interconnect assembly (or an interposer incorporating one or more interconnect assemblies) may be configured such that it can be substituted for an existing pogo pin tower without redesigning the remainder of the probe card assembly.

The invention herein has been described and illustrated with respect to certain exemplary embodiments. It should be understood by those skilled in the art that the foregoing and various other changes, omissions and additions may be made therein and thereto, without departing from the spirit and scope of the present invention.

For example, although various embodiments have been described in connection with a space transformer (e.g., the configuration illustrated in FIG. 1 includes a space transformer 16), if the spacing of the contact pads on the integrated circuit (IC) device being tested is sufficiently wide (e.g., in the case of certain test sockets for a packaged or partially packaged IC device), the space transformer may be omitted. In such a case, the tips of the projecting arms of the conductive contact of the interconnect assembly may engage the contact pads of the IC device directly.

Although the present invention has been primarily described in connection with a rectangular array of apertures defined by an insulative sheet, where each aperture is configured to receive arms of a respective conductive contact, it is not limited thereto. While a rectangular grid is often the most compact configuration of apertures/conductive contacts, other configurations are contemplated.

Although the present invention has been described with respect to conductive contacts having certain shapes/configurations (e.g., the conductive contacts illustrated in FIGS. 3A and 4A), the invention is not limited thereto. Rather, the shape/configuration of the contacts may be selected as is desired to provide a desired contact tip position, a desired resiliency, etc.

What is claimed is:

1. An interconnect assembly for providing electrical interconnection between elements of a probe card assembly, the interconnect assembly comprising:
    a first frame defining a plurality of first openings;
    a plurality of first conductive contacts coupled to the first frame, each first conductive contact including (a) a first resilient arm extending away from a first surface of the first frame and (b) a second resilient arm extending away from a second surface of the first frame, at least one of the first resilient arm or the second resilient arm extending from one of the fist surface and the second surface of the first frame to the other surface of the first frame through one of the plurality of first openings;
    a second frame defining a plurality of second openings; and
    a plurality of second conductive contacts coupled to the second frame, each second conductive contact including (a) a first resilient arm extending away from a first surface of the second frame and (b) a second resilient arm extending away from a second surface of the second frame, at least one of the first resilient arm or the second resilient arm extending from one of the first surface and the second surface of the second frame to the other surface of the second frame through one of the plurality of second openings, and wherein a first resilient arm of the plurality of first conductive contacts is in direct physical contact with a second resilient arm of the plurality of second conductive contacts.

2. The interconnect assembly of claim 1 wherein the first resilient arm of each of the plurality of first conductive contacts includes a first tip portion configured to contact a conductive region of a PCB of the probe card assembly, and the second resilient arm of the each of the plurality of second conductive contacts includes a second tip portion configured to contact a conductive region of a space transformer of the probe card assembly.

3. The interconnect assembly of claim 1 wherein the first and second frames and the respective conductive contacts are configured to provide resilience during probing of semiconductor devices using the probe card assembly.

4. The interconnect assembly of claim 1 wherein at least one of the frames comprises an insulative material.

5. The interconnect assembly of claim 1 wherein at least one of the frames comprises a polyimide material.

6. The interconnect assembly of claim 1 wherein each of the conductive contacts of at least one of the plurality of first and second conductive contacts includes (a) another first resilient arm extending away from the first surface of the respective frame and (b) another second resilient arm extending away from the second surface of the respective frame.

7. A probe card assembly comprising:
    a space transformer including a first plurality of conductive regions adjacent a first surface of the space transformer;
    a printed circuit board including a second plurality of conductive regions adjacent a first surface of the printed circuit board;
    an interconnect assembly providing electrical interconnection between the space transformer and the printed circuit board, the interconnect assembly comprising:
        a first frame defining a plurality of first openings;
        a plurality of first conductive contacts coupled to the first frame, each first conductive contact including (1) a first resilient arm extending away from a first surface of the first frame and (2) a second resilient arm extending away from a second surface of the first frame, at least one of the first resilient arm or the second resilient arm extending from one of the first surface and the second surface of the first frame to the other surface of the first frame through one of the plurality of first openings;
        a second frame defining a plurality of second openings; and
        a plurality of second conductive contacts coupled to the second frame, each second conductive contact including (a) a first resilient arm extending away from a first surface of the second frame and (b) a second resilient arm extending away from a second surface of the second frame, at least one of the first resilient arm or the second resilient arm extending from one of the first surface and the second surface of the second frame to the other surface of the second frame through one of the plurality of second openings, and wherein a first resilient arm of the plurality of first conductive contacts coupled to the first frame is in electrical contact with a second resilient arm of the plurality of second conductive contacts coupled to the second frame through one of direct physical contact and electrical contact at approximately the ends of the respective arms through a spacer substrate.

8. The probe card assembly of claim 7 wherein the first resilient arm of each of the plurality of first conductive contacts includes a first tip portion configured to contact a respective one of the first plurality of conductive regions and the second resilient arm of each of the plurality of second conductive contacts includes a second tip portion configured to contact a respective one of the second plurality of conductive regions.

9. The probe card assembly of claim 7 wherein each of the first interconnect assembly and the second interconnect assembly are stacked such that electrical interconnection between the space transformer and the printed circuit board is provided through both the first interconnect assembly and the second interconnect assembly.

10. The probe card assembly of claim 9 wherein the first interconnect assembly and the second interconnect assembly are stacked such that (a) a tip portion of one of the first resilient arm and the second resilient arm of a conductive contact of the first interconnect assembly is in contact with (b) another tip portion of one of the first resilient arm and the second resilient arm of a conductive contact of the second interconnect assembly.

11. The probe card assembly of claim 7 further comprising a spacer substrate, wherein each of the first interconnect assembly and the second interconnect assembly are disposed on opposite sides of the spacer substrate within the probe card assembly.

12. The probe card assembly of claim 11 wherein (a) a tip portion of one of the first resilient arm and the second resilient arm of a conductive contact of the first interconnect assembly is in contact with a conductive region on one of the opposite sides of the substrate and (b) another tip portion of one of the first resilient arm and the second resilient arm of a conductive contact of the second interconnect assembly is in contact with a conductive region on the other of the opposite sides of the substrate.

13. The probe card assembly of claim 7 wherein each of the first and second frames and the respective conductive contacts are configured to provide resilience during probing of semiconductor devices using the probe card assembly.

14. The probe card assembly of claim 7 wherein at least one of the first and second frames comprises an insulative material.

15. The probe card assembly of claim 7 wherein at least one of the first and second frames comprises a polyimide material.

16. The probe card assembly of claim 7 wherein each of the conductive contacts of at least one of the plurality of first and second conductive contacts includes (a) another first resilient arm extending away from the first surface of the respective frame and (b) another second resilient arm extending away from the second surface of the respective frame.

17. An interposer for providing electrical interconnection between elements of a probe card assembly) the interposer comprising:
 a first interconnect assembly, the first interconnect assembly including
  (1) a first frame defining a plurality of first openings; and
  (2) a plurality of first conductive contacts coupled to the first frame, each first conductive contact including (a) a first resilient aim extending away from a first surface of the first frame and (b) a second resilient arm extending away from a second surface of the first frame, at least one of the first resilient arm or the second resilient aim of the first conductive contact extending from one of the first surface and the second surface to the other surface through one of the plurality of first openings; and
 a second interconnect assembly, the second interconnect assembly including
  (1) a second frame defining a plurality of second openings; and
  (2) a plurality of second conductive contacts coupled to the second frame, each second conductive contact including (a) a first resilient arm extending away from a first surface of the second frame and (b) a second resilient arm extending away from a second surface of the second frame, at least one of the first resilient arm or the second resilient arm of the second conductive contact extending from one of the first and the second surfaces of the second frame to the other surface of the second frame through one of the plurality of second openings, wherein both physical and electrical contact are provided between corresponding pairs of first conductive contacts of the first interconnect assembly and second conductive contacts of the second interconnect assembly.

18. The interposer of claim 17 further comprising a spacer substrate disposed between the first interconnect assembly and the second interconnect assembly.

19. The interposer of claim 18 wherein (a) a first tip portion of one of the first resilient arm and the second resilient arm of the first conductive contact of the first interconnect assembly is in contact with a conductive region on one of two opposite sides of the spacer substrate and (b) a second tip portion of one of the first resilient arm and the second resilient arm of the second conductive contact of the second interconnect assembly is in contact with a conductive region on the other of the two opposite sides of the spacer substrate.

20. The interposer of claim 17 wherein the first interconnect assembly and the second interconnect assembly are stacked such that (a) a first tip portion of one of the first resilient arm and the second resilient arm of the first conductive contact of the first interconnect assembly is in contact with (b) a second tip portion of one of the first resilient arm and the second resilient arm of the second conductive contact of the second interconnect assembly.

21. An interposer for providing electrical interconnection between elements of a probe card assembly, the interposer comprising a first interconnect assembly and at least a second interconnect assembly, each of the interconnect assemblies comprising:
 (1) a frame defining a plurality of openings; and
 (2) a plurality of conductive contacts coupled to the frame, each conductive contact including (a) a first resilient arm extending away from a first surface of the frame and (b) a second resilient arm extending away from a second surface of the frame, at least one of the first resilient arm or the second resilient arm of the first conductive contact extending from one of the first surface and the second surface to the other surface trough one of the plurality of openings, wherein corresponding conductive contacts of the first interconnect assembly and the second interconnect assembly are in direct physical contact and wherein the first and at least a second interconnect assembly are configured for stacking to provide at least one of additional resilience and additional height to the probe card assembly.

* * * * *